United States Patent
Shishido et al.

(10) Patent No.: US 10,365,556 B2
(45) Date of Patent: Jul. 30, 2019

(54) MASK BLANK, PHASE SHIFT MASK, METHOD FOR MANUFACTURING PHASE SHIFT MASK, AND METHOD FOR MANUFACTURING SEMICONDUCTOR DEVICE

(71) Applicant: HOYA CORPORATION, Tokyo (JP)

(72) Inventors: Hiroaki Shishido, Tokyo (JP); Osamu Nozawa, Tokyo (JP)

(73) Assignee: HOYA CORPORATION, Shinjuku-ku, Tokyo (JP)

(*) Notice: Subject to any disclaimer, the term of this patent is extended or adjusted under 35 U.S.C. 154(b) by 135 days.

(21) Appl. No.: 15/561,124

(22) PCT Filed: Mar. 24, 2016

(86) PCT No.: PCT/JP2016/059326
§ 371 (c)(1),
(2) Date: Sep. 25, 2017

(87) PCT Pub. No.: WO2016/158649
PCT Pub. Date: Oct. 6, 2016

(65) Prior Publication Data
US 2018/0129130 A1 May 10, 2018

(30) Foreign Application Priority Data
Mar. 27, 2015 (JP) .................. 2015-067259

(51) Int. Cl.
*G03F 1/32* (2012.01)
*C23C 14/06* (2006.01)

(52) U.S. Cl.
CPC .............. *G03F 1/32* (2013.01); *C23C 14/06* (2013.01); *C23C 14/0652* (2013.01); *C23C 14/0682* (2013.01)

(58) Field of Classification Search
CPC ....... G03F 1/32; C23C 14/06; C23C 14/0652; C23C 14/0682

USPC ............................................ 430/5
See application file for complete search history.

(56) References Cited

U.S. PATENT DOCUMENTS

| 5,547,787 | A | 8/1996 | Ito et al. |
| 2002/0122991 | A1 | 9/2002 | Shiota et al. |
| 2003/0180630 | A1 | 9/2003 | Shiota et al. |
| 2005/0244722 | A1 | 11/2005 | Okada et al. |
| 2006/0166106 | A1 | 7/2006 | Chandrachood et al. |
| 2013/0309601 | A1 | 11/2013 | Fukaya et al. |

FOREIGN PATENT DOCUMENTS

| JP | 06-083034 A | 3/1994 |
| JP | 07-128840 A | 5/1995 |
| JP | 2002-258460 A | 9/2002 |
| JP | 2004-004791 A | 1/2004 |
| JP | 2005-208282 A | 8/2005 |
| JP | 2005-284213 A | 10/2005 |
| JP | 2006-209128 A | 8/2006 |
| KR | 10-2013-0128338 A | 11/2013 |

OTHER PUBLICATIONS

International Search Report for PCT/JP2016/059326 dated Jun. 28, 2016 [PCT/ISA/210].
Written Opinion for PCT/JP2016/059326 dated Jun. 28, 2016 [PCT/ISA/237].
Communication dated May 27, 2019 issued by the Korean Intellectual Property Office in counterpart application No. 10-2017-7030296.

*Primary Examiner* — Christopher G Young
(74) *Attorney, Agent, or Firm* — Sughrue Mion, PLLC

(57) ABSTRACT

Provided is a mask blank including a phase shift film on a transparent substrate. This phase shift film includes a phase shift layer at least containing a transition metal and silicon, and a silicon layer, which is configured to attenuate exposure light with which the phase shift layer is irradiated, and the silicon layer is formed to be in contact with the substrate side of the phase shift layer. This mask blank is used in manufacturing a phase shift mask to which laser exposure light having a wavelength of 200 nm or less is applied.

18 Claims, 3 Drawing Sheets

MASK BLANK, PHASE SHIFT MASK, METHOD FOR MANUFACTURING PHASE SHIFT MASK, AND METHOD FOR MANUFACTURING SEMICONDUCTOR DEVICE

CROSS REFERENCE TO RELATED APPLICATIONS

This application is a National Stage of International Application No. PCT/JP2016/059326 filed Mar. 24, 2016, claiming priority based on Japanese Patent Application No. 2015-067259 filed Mar. 27, 2015, the contents of all of which are incorporated herein by reference in their entirety.

TECHNICAL FIELD

This invention relates to a phase shift mask, which is used in manufacturing a semiconductor device, and a mask blank, which is used in manufacturing the phase shift mask. This invention relates more particularly to a phase shift mask, which is suitably used with an exposure apparatus using exposure light having a short wavelength of 200 nm or less as an exposure light source, and to a method of manufacturing the phase shift mask.

BACKGROUND ART

In general, in a production step of a semiconductor device, a fine pattern is formed using a photolithography method. Further, in forming the fine pattern, a large number of substrates, which are called transfer masks (photomasks), are generally used. In the transfer mask, in general, a fine pattern formed of a metal thin film or the like is provided on a transparent glass substrate. The photolithography method is also used in manufacturing this photomask.

In recent years, the pattern of the semiconductor device has become significantly finer. In forming a finer pattern of the semiconductor device, in addition to forming a finer mask pattern in a transfer mask, there is a need to use an exposure light source having a shorter wavelength in photolithography. Specifically, in recent years, the wavelength of the exposure light source used in producing the semiconductor device has become shorter from KrF excimer laser (wavelength: 248 nm) to ArF excimer laser (wavelength: 193 nm).

Moreover, as types of the transfer mask, in addition to a related-art binary mask including a light shielding film pattern made of a chromium-based material on a transparent substrate, a halftone-type phase shift mask is known. This halftone-type phase shift mask has the structure including a semi-transparent film (phase shift film) on the transparent substrate. This semi-transparent film is configured to transmit light having an intensity that does not substantially contribute to exposure (for example, 1% to 20% with respect to an exposure wavelength), and has a predetermined phase difference. For the semi-transparent film, a material made of a transition metal silicide-based compound, for example, molybdenum silicide is widely used. This halftone-type phase shift mask includes a semi-transparent portion, which is obtained by patterning the semi-transparent film, and a light transparent portion, in which the semi-transparent film is not formed, and which transmits light having an intensity that substantially contributes to exposure, to establish a relationship in which a phase of the light that has been transmitted through the semi-transparent portion is substantially reversed with respect to a phase of the light that has been transmitted through the light transparent portion so that light beams that have passed through a vicinity of a boundary portion between the semi-transparent portion and the light transparent portion and turned into each other's region by a diffraction phenomenon cancel each other, to thereby make a light intensity in the boundary portion substantially zero and increase a contrast, that is, a resolution in the boundary portion.

Incidentally, with the reduction in wavelength of the exposure light source in recent years, deterioration of the transfer mask caused by repeated use of the transfer mask has become significant. In particular, in a case of a phase shift mask using the above-mentioned transition metal silicide-based material, due to irradiation with ArF excimer laser (wavelength: 193 nm) from the exposure light source, changes in transmittance and phase difference occur, and a phenomenon in which a line width is changed (increased) further occurs. In the case of the phase shift mask, such changes in transmittance and phase difference are serious problems that affect mask performance. When the change in transmittance is increased, transfer accuracy is reduced, and when the change in phase difference is increased, it becomes harder to obtain the phase shift effect in the pattern boundary portion, the contrast in the pattern boundary portion is reduced, and the resolution is significantly reduced. In addition, the change in line width also reduces critical dimension (CD) accuracy of the photomask, and eventually CD accuracy of a semiconductor substrate on which the transfer is performed.

PRIOR ART DOCUMENTS

Patent Document
Patent Document 1: JP 2010-217514 A
Patent Document 2: JP 2013-254206 A

SUMMARY OF THE INVENTION

Problem to be Solved by the Invention

Based on consideration of the inventors of this invention, the background of such problem of the deterioration of the transfer mask caused by the repeated use of the transfer mask is assumed as follows. Heretofore, when haze occurs, cleaning for removing the haze has been performed, for example, but a reduction (elution) of the film due to the cleaning has been unavoidable. In other words, the number of times of cleaning has determined the life of the mask. However, with the improvement of haze in recent years, the number of times of cleaning has been decreased. Therefore, a period of repeated use of the mask has been elongated, and exposure time has been elongated accordingly. As a result, there has newly appeared a problem of light fastness to short-wavelength light, for example, ArF excimer laser, in particular.

In the related art, in order to improve the light fastness of the semi-transparent film, Patent Document 1 listed above, for example, discloses a method in which plasma treatment, UV irradiation treatment, or heat treatment is performed on a transition metal silicide-based film after the pattern is formed, to thereby form a passive film on a surface of a pattern of the transition metal silicide-based film. Through the formation of the passive film on the surface of the pattern, it is intended to increase the light fastness of the transition metal silicide-based film with respect to exposure light.

Moreover, Patent Document 2 listed above describes an example of a semi-transparent film using an incomplete nitride film in which a proportion of a transition metal in a total of silicon and the transition metal is less than 9 atom %, and is insufficiently nitrided. In Patent Document 2, through control of bonding between the transition metal and nitrogen, and bonding between the transition metal and silicon, it is intended to prevent oxidation of the transition metal accompanying irradiation with the exposure light, to thereby increase the light fastness.

With such methods described in Patent Document 1 and Patent Document 2, there can be obtained the effect of suppressing alteration of a transition metal silicide-based thin film accompanying the irradiation with the exposure light. However, the method disclosed in Patent Document 1 has a problem in that it is difficult to uniformize a layer thickness (film thickness) of a passivated region. Unless the layer thickness of the passivated region is uniformized, a refractive index and an extinction coefficient are not uniformized. In addition, the method described in Patent Document 2 has a problem in that, when the incomplete nitride film is formed so as to establish a desired bonding state, setting of conditions for a nitrogen flow rate at the time of film formation and for controlling a pressure inside a film forming chamber is complicated. In short, in the related-art technologies, while the effect of increasing the light fastness is obtained to a certain extent, it is difficult to achieve a stable effect of increasing the light fastness, and it is difficult to obtain a mask with stable quality even after a long-term use.

In view of the above, this invention has been made to solve the problems in the related art, and therefore has the following objects: first, to provide a mask blank having excellent light fastness of a transition metal silicide-based phase shift film with respect to exposure light having a wavelength of 200 nm or less, and having excellent stability of quality; second, to provide a phase shift mask manufactured using the mask blank; and third, to provide a method of manufacturing a semiconductor device to which the phase shift mask is applied.

Means to Solve the Problem

The inventors of this invention assumed that, with the reduction in wavelength of the exposure light source, the deterioration of the photomask caused by the repeated use has become significant due to the following factors.

As a result of investigating semi-transparent film patterns of phase shift masks in which the changes in transmittance and phase difference occurred after the repeated use, the inventors of this invention have found that an altered layer containing Si and O and a slight amount of Mo is formed on a surface layer side of a MoSi-based film, and the altered layer is one of major reasons for the changes in transmittance and phase difference, and the change (increase) in line width. The reason (mechanism) for the generation of such altered layer is assumed to be as follows. Specifically, the related-art MoSi-based film (semi-transparent film) formed by sputtering structurally has a gap, and even with annealing after the film formation, a change in structure of the MoSi film is small. Therefore, in the course of using the photomask, oxygen ($O_2$) and water ($H_2O$) in the air, and ozone ($O_3$), which is generated when oxygen ($O_2$) reacts with ArF excimer laser, for example, intrude into the gap to react with Si and Mo forming the semi-transparent film. In other words, under such environment, Si and Mo forming the semi-transparent film are excited to enter transition states when irradiated with exposure light (in particular, ArF or other such short-wavelength light). As a result, Si is oxidized and expanded (because $SiO_2$ has a volume that is larger than that of Si), and Mo is also oxidized to generate the altered layer on the surface layer side of the semi-transparent film. Then, it is assumed that, through the irradiation with the exposure light in an accumulated manner during the repeated use of the photomask, the oxidation and the expansion of Si further proceed, and oxidized Mo is diffused in the altered layer, and is precipitated on the surface to sublime as $MoO_3$, for example, with the result that the thickness of the altered layer is gradually increased (proportion occupied by the altered layer in the MoSi film is increased). Such phenomenon in which the altered layer is generated and further enlarged is recognized noticeably in the case of ArF excimer laser or other such exposure light having a short wavelength, which has energy required for those constitutional atoms, which trigger the oxidation reaction of Si and Mo forming the semi-transparent film, to be excited to enter the transition states.

Based on the above-mentioned revealed facts and considerations, the inventors of this invention have devised this invention as a result of focusing attention, as a countermeasure to suppress the generation and enlargement of the altered layer, on attenuating the exposure light with which a MoSi film or other such phase shift film is irradiated, and of further continuing extensive research.

Specifically, in order to solve the problems described above, this invention has the following configuration.

(Structure 1)

A mask blank, which is used in manufacturing a phase shift mask to which laser exposure light having a wavelength of 200 nm or less is applied, the mask blank comprising a phase shift film on a transparent substrate, the phase shift film including a phase shift layer at least containing a transition metal and silicon, and a silicon layer, which is configured to attenuate the exposure light with which the phase shift layer is irradiated, the silicon layer being formed to be in contact with the substrate side of the phase shift layer.

(Structure 2)

A mask blank according to Structure 1, wherein the silicon layer has a film density of 2.1 $g/cm^3$ or more and 2.5 $g/cm^3$ or less.

(Structure 3)

A mask blank according to Structure 1 or 2, wherein the silicon layer has a thickness of 3 nm or more and 20 nm or less.

(Structure 4)

A mask blank according to any one of Structures 1 to 3, wherein the silicon layer has a transmittance of 30% or more and 70% or less with respect to the exposure light.

(Structure 5)

A mask blank according to any one of Structures 1 to 4, wherein the phase shift layer further contains any one or both of nitrogen and oxygen.

(Structure 6)

A mask blank according to any one of Structures 1 to 5, wherein the transition metal of the phase shift layer comprises molybdenum.

(Structure 7)

A mask blank according to any one of Structures 1 to 6, wherein the phase shift layer has a thickness of 100 nm or less.

(Structure 8)

A mask blank according to any one of Structures 1 to 7, further comprising a light shielding film containing chromium as a main component on a surface of the phase shift film that is opposite to the substrate.

(Structure 9)

A mask blank according to Structure 8, further comprising a hard mask film containing silicon on a surface of the light shielding film that is opposite to the phase shift film.

(Structure 10)

A method of manufacturing a phase shift mask, the method comprising a step of patterning the phase shift film of the mask blank of any one of Structures 1 to 9.

(Structure 11)

A phase shift mask, to which laser exposure light having a wavelength of 200 nm or less is applied, the phase shift mask comprising a phase shift film pattern on a transparent substrate, the phase shift film pattern including a phase shift layer at least containing a transition metal and silicon, and a silicon layer, which is configured to attenuate the exposure light with which the phase shift layer is irradiated, the silicon layer being formed to be in contact with the substrate side of the phase shift layer.

(Structure 12)

A method of manufacturing a semiconductor device, the method comprising a step of transferring, using the phase shift mask manufactured by the method of manufacturing a phase shift mask of Structure 10 or using the phase shift mask of Structure 11, a transfer pattern of the phase shift mask onto a semiconductor substrate by a lithography method.

Effect of the Invention

According to the mask blank of this invention, the mask blank includes the phase shift film on the transparent substrate. The phase shift film includes the phase shift layer at least containing the transition metal and silicon, and the silicon layer, which is configured to attenuate exposure light with which the phase shift layer is irradiated. The silicon layer is formed to be in contact with the substrate side of the phase shift layer. With this configuration, the silicon layer exists below (on the substrate side, that is, exposure side of) the phase shift layer, and in the phase shift mask manufactured using the mask blank, the phase shift layer is irradiated with the attenuated exposure light. Therefore, the transition metal contained in the phase shift layer is less likely to be excited by the exposure light, with the result that the oxidation and alteration of the phase shift layer containing the transition metal silicide can be effectively suppressed. Therefore, according to this invention, there can be provided the mask blank having the excellent light fastness of the transition metal silicide-based phase shift film with respect to the exposure light having the wavelength of 200 nm or less, and having the excellent stability of quality.

Moreover, the phase shift mask manufactured using such mask blank according to this invention has, as described above, the excellent light fastness of the transition metal silicide-based phase shift film with respect to the exposure light having the wavelength of 200 nm or less, and has the excellent stability of quality.

Further, through transfer of the pattern using the phase shift mask, a high-quality semiconductor device having excellent pattern accuracy can be produced.

MODES FOR EMBODYING THE INVENTION

Now, embodiments of this invention will be described in detail with reference to the drawings.

As described above, as a result of extensive study focusing attention, as a countermeasure to suppress the generation and enlargement of the altered layer, on attenuating the exposure light with which the MoSi film or other such phase shift film is irradiated, the inventors of this invention have found that the above-mentioned problems can be solved by this invention having the following configuration.

That is, this invention relates to, as in Structure 1, a mask blank, which is used in manufacturing a phase shift mask to which laser exposure light having a wavelength of 200 nm or less is applied, the mask blank including a phase shift film on a transparent substrate, the phase shift film including a phase shift layer at least containing a transition metal and silicon, and a silicon layer, which is configured to attenuate exposure light with which the phase shift layer is irradiated, the silicon layer being formed to be in contact with the substrate side of the phase shift layer. The mask blank according to this invention is suitable for manufacturing, among other phase shift masks, a halftone-type phase shift mask in particular.

Figure 1:
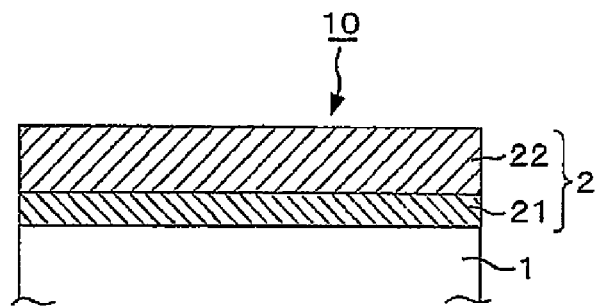
FIG. 1 is a schematic cross-sectional view of a mask blank according to one embodiment of this invention.

FIG. 1 is a schematic cross-sectional view of a mask blank according to one embodiment of this invention.

As illustrated in FIG. 1, a mask blank 10 according to the one embodiment of this invention has the structure including a phase shift film 2 on a transparent substrate 1. Here, the above-mentioned phase shift film 2 includes a phase shift layer 22 at least containing a transition metal and silicon, and a silicon layer 21, which is configured to attenuate exposure light with which the phase shift layer 22 is irradiated, and the above-mentioned silicon layer 21 is formed to be in contact with the substrate 1 side of the above-mentioned phase shift layer. In other words, in the one embodiment, the mask blank 10 includes, on the transparent substrate 1, the phase shift film 2 including the silicon layer 21 and the phase shift layer 22, which are laminated in the stated order.

Here, the transparent substrate 1 in the mask blank 10 is not particularly limited as long as being a substrate used in a transfer mask for manufacturing a semiconductor device. When used in a mask blank for a phase shift type mask, the transparent substrate 1 is not particularly limited as long as being a substrate having transparency with respect to an exposure wavelength to be used, and a synthetic quartz substrate and other such glass substrates (for example, soda-lime glass, aluminosilicate glass, and other type of glass) are used. Among others, the synthetic quartz substrate has high transparency in a region of ArF excimer laser (wavelength: 193 nm) or shorter wavelength, which is effective in forming a fine pattern, and hence is used particularly preferably.

In this invention, the above-mentioned phase shift film 2 has a laminate structure of the silicon layer 21 and the phase shift layer 22. The above-mentioned silicon layer 21 exists below (on the substrate side of) the above-mentioned phase shift layer 22.

The above-mentioned phase shift layer 22 is formed of a material at least containing the transition metal and silicon. However, the structure of the above-mentioned phase shift layer 22 that is applicable to this invention does not need to be particularly limited, and the structure of a phase shift film of a phase shift type mask that has been conventionally used may be applied to the phase shift layer 22, for example.

Preferred examples of such phase shift layer 22 include a semi-transparent film containing a metal silicide made of a transition metal and silicon, or a semi-transparent film containing a transition metal silicide-based material containing, in addition to the transition metal and silicon, one or more elements selected from oxygen, nitrogen, and carbon for improving optical characteristics, physical properties (such as etching rate and etching selectivity to another film (layer)), and the like of the film.

Examples of the transition metal include molybdenum, tantalum, tungsten, titanium, chromium, nickel, vanadium, zirconium, ruthenium, and rhodium. Of those, molybdenum is particularly suitable. When the transition metal is molybdenum, the problem of alteration of the phase shift film by the exposure light in the related art occurs conspicuously, and hence the actions and effects of this invention are exerted in particular.

As the above-mentioned material at least containing a transition metal and silicon, specifically, a transition metal silicide, or a material containing a nitride, oxide, carbide, oxynitride, carbonate, or carbon oxynitride of a transition metal silicide is suitable.

Moreover, in this invention, the above-mentioned phase shift layer 22 may be applied to any one of a single-layer structure, or a laminate structure formed of a low-transmittance layer and a high-transmittance layer.

It is desired that a preferred thickness of the above-mentioned phase shift layer 22 be appropriately adjusted in view of a phase shift function and light transmittance, in particular, depending on the material. Moreover, in this invention, the above-mentioned phase shift film 2 has the laminate structure of the silicon layer 21 and the phase shift layer 22. Therefore, in consideration of a phase difference and a light transmittance of the silicon layer 21, and from viewpoints of a phase shift function and a light transmittance of the phase shift film 2 as a whole, it is desired to adjust the thickness of the above-mentioned phase shift layer 22. In general, for example, the thickness is in a range of preferably 100 nm or less, more preferably 80 nm or less.

Moreover, the above-mentioned silicon layer 21, which is located below (on the substrate side, in other words, the exposure side of) the above-mentioned phase shift layer 22, has a function of attenuating the exposure light with which the phase shift layer 22 is irradiated.

With the above-mentioned silicon layer 21 existing on the substrate side, that is, on the side irradiated with the exposure light of the phase shift layer 22, in a phase shift mask manufactured using the mask blank, the phase shift layer 22 is irradiated with the attenuated exposure light. Therefore, the transition metal contained in the phase shift layer 22 is less likely to be excited by the exposure light, and the oxidation and alteration of the phase shift layer 22 containing a transition metal silicide can be effectively suppressed. Therefore, there can be obtained a mask blank having excellent light fastness of a transition metal silicide-based phase shift film with respect to the exposure light having the wavelength of 200 nm or less, and having excellent stability in quality.

Moreover, with the use of the silicon layer, dry etching selectivity to the transparent substrate 1 (for example, synthetic quartz glass) is also ensured.

As used herein, the term "silicon layer" includes the case where impurity elements are inevitably incorporated in a stage of forming a thin film, and the case where the impurity elements are contained by being incorporated with a change with time after the film formation. For example, when the silicon layer is formed by a sputtering method, the "silicon layer" in this invention encompasses the concept of a layer in a state of being mixed with slight amounts of impurity components contained in a target, rare gas components incorporated in the thin film in the film forming step, and other such components derived from the silicide film as the upper layer or the substrate as a base with the change with time after the film formation. In short, unless a silicon compound layer is formed to intentionally contain components other than silicon, the layer is encompassed by the configuration of this invention.

The above-mentioned silicon layer 21 has a film density of preferably 2.1 g/cm$^3$ or more, more preferably 2.2 g/cm$^3$ or more. When the film density is less than 2.1 g/cm$^3$, voids in the Si layer are increased, and hence there arises a fear of receiving oxygen and other such components from adjacent substrate and upper layer. Meanwhile, when the film density exceeds 2.5 g/cm$^3$, the silicon layer 21 becomes excessively denser, and there is a problem in that etching time in performing dry etching becomes much longer. Therefore, the film density is preferably 2.1 g/cm$^3$ or more and 2.5 g/cm$^3$ or less, more preferably 2.2 g/cm$^3$ or more and 2.3 g/cm$^3$ or less. The film density may be measured by an X-ray reflectometry method (XRR method) or other such known method (the same applies hereinafter).

Moreover, a thickness of the above-mentioned silicon layer 21 does not need to be particularly limited, but in the one embodiment, it is preferred that the thickness be in a range of 3 nm or more and 20 nm or less, for example. When the thickness is less than 3 nm, there is a fear of not sufficiently exerting the effect of attenuating the exposure light with which the phase shift layer 22 is irradiated, to thereby suppress the alteration of the phase shift layer 22. Meanwhile, when the thickness exceeds 20 nm, an amount of attenuation of energy of the exposure light with which the phase shift layer 22 is irradiated is increased, and there is a fear of affecting the transfer of the pattern during manufacture of a semiconductor device.

Moreover, as described above, there is a need to adjust optical characteristics of the above-mentioned phase shift film 2 as a whole especially from the viewpoints of the phase shift function and the light transmittance. However, the silicon layer 21 in this invention has a small refractive index, and has a relatively small effect on a phase difference in the phase shift layer 22, which is located thereabove. Therefore, it is desired to design the above-mentioned phase shift film 2 (or the above-mentioned phase shift layer 22) mainly in consideration of the light transmittance of the silicon layer 21.

It is preferred that, although being different depending on the thickness, the transmittance of the above-mentioned silicon layer 21 with respect to the exposure light be 30% or more and 70% or less, for example. Within this range, it is easy to adjust a transmittance of the phase shift layer 22, which is located thereabove, with respect to the exposure light.

The above-mentioned phase shift film 2 is required to have the transmittance of 2% or more with respect to the exposure light. In order to generate a sufficient phase shift effect between the exposure light that has been transmitted through the phase shift film 2 and the exposure light that has been transmitted through the air, the transmittance of at least 2% with respect to the exposure light is required. The transmittance of the phase shift film 2 with respect to the exposure light is preferably 3% or more, more preferably 4% or more. Meanwhile, the transmittance of the phase shift film 2 with respect to the exposure light is preferably 30% or less, more preferably 20% or less, still more preferably 10% or less.

In order to obtain an appropriate phase shift effect, the phase shift film 2 is required to be adjusted so that the phase shift film 2 has a phase difference in a range of 150 degrees or more and 180 degrees or less between the ArF exposure light that has been transmitted therethrough and light that has passed through the air by a distance that is the same as a thickness of the phase shift film 2. The above-mentioned phase difference in the phase shift film 2 is preferably 155 degrees or more, more preferably 160 degrees or more. Meanwhile, the above-mentioned phase difference in the phase shift film 2 is preferably 179 degrees or less, more preferably 177 degrees or less. This is to reduce the effect of an increase in phase difference caused by the transparent substrate 1 being etched by a slight amount during dry etching in forming the pattern in the phase shift film 2. This is also because in recent years, in an increasing number of methods of irradiating the phase shift mask with the exposure light by an exposure apparatus, the exposure light is allowed to enter from a direction that is inclined at a predetermined angle with respect to a direction perpendicular to a surface of the phase shift film 2.

A method of forming the phase shift film 2 made of a laminate film, in which the silicon layer 21 and the phase shift layer 22 are laminated in the stated order, on the transparent substrate 1, for example, the mask blank 10 illustrated in FIG. 1, does not need to be particularly limited, but a preferred example includes, among others, a sputter deposition method. The sputter deposition method is preferred because a uniform film having a constant thickness may be formed.

Moreover, the mask blank 10 according to the one embodiment may include another constituent layer between the transparent substrate 1 and the phase shift film 2 as long as the actions and effects of this invention are not compromised. An example of such constituent layer is an etching stopper layer made of a Cr-based material, which is not etched with a fluorine-based gas.

Figure 2:
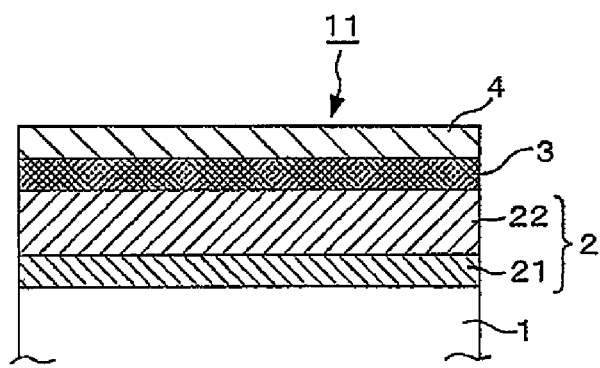
FIG. 2 is a schematic cross-sectional view of a mask blank according to another embodiment of this invention.

FIG. 2 is a schematic cross-sectional view of a mask blank according to another embodiment of this invention.

As illustrated in FIG. 2, the mask blank according to this invention may be a mask blank 11 having the structure including the above-mentioned phase shift film 2, which is formed by laminating the silicon layer 21 and the phase shift layer 22, on the transparent substrate 1, and further including a light shielding film 3 and a hard mask film 4 on the phase shift film 2. The mask blank 11 may be used in manufacturing a halftone-type phase shift mask including a light shielding ring in a peripheral region of the mask, for example.

The above-mentioned transparent substrate 1 and the above-mentioned phase shift film 2, which is formed by laminating the silicon layer 21 and the phase shift layer 22, have been described above, and a duplicate description thereof is omitted here.

In the mask blank 11 according to the another embodiment, the above-mentioned light shielding film 3 is provided for the purpose of transferring a pattern of the hard mask film 4 to the phase shift film 2 as closely as possible.

In order to ensure the etching selectivity to the phase shift layer 22 formed of the transition metal silicide-based material, the above-mentioned light shielding film 3 is formed of a material containing chromium.

Examples of the material containing chromium include elemental chromium (Cr) or chromium compounds obtained by adding elements such as oxygen, nitrogen, and carbon to chromium (such as CrN, CrC, CrO, CrON, CrCN, CrOC, and CrOCN).

The material containing chromium, which forms the above-mentioned light shielding film 3, may contain one or more elements of molybdenum, indium, and tin. Containing the one or more elements of molybdenum, indium, and tin can further increase an etching rate with respect to a mixture gas of a chlorine-based gas and an oxygen gas.

As long as etching selectivity to a material forming the above-mentioned phase shift layer 22 (in particular, surface layer portion) in dry etching can be obtained, the above-mentioned light shielding film 3 may be formed of a material containing the transition metal and silicon. This is because the material containing the transition metal and silicon has a high light shielding property to allow a reduction in thickness of the light shielding film 3. Examples of the transition metal to be contained in the light shielding film 3 include any one of metals such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), and palladium (Pd), and alloys of those metals. Examples of metallic elements other than the transition metal element to be contained in the light shielding film 3 include aluminum (Al), indium (In), tin (Sn), and gallium (Ga).

Meanwhile, the above-mentioned light shielding film 3 may have the structure in which a layer made of a material containing chromium, and a layer made of a material containing the transition metal and silicon are laminated in the stated order from the phase shift film 2 side. Specifics of the material containing chromium and the material containing the transition metal and silicon in this case are similar to the case of the above-mentioned light shielding film 3.

Figure 3:
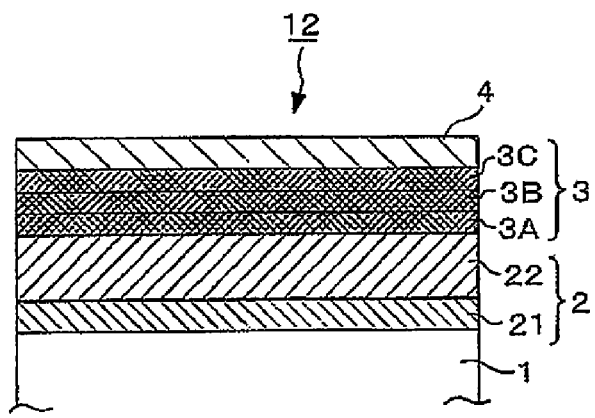
FIG. 3 is a schematic cross-sectional view of a mask blank according to still another embodiment of this invention.

The above-mentioned light shielding film 3 may have a single-layer structure or a laminate structure. For example, the light shielding film 3 may have a two-layer structure of a light shielding layer and a front-surface antireflection layer, or a three-layer structure obtained by further adding a rear-surface antireflection layer to the two-layer structure. In FIG. 3, there is illustrated a mask blank 12 according to still another embodiment of this invention, in which the above-mentioned light shielding film 3 is formed of a three-layer structure of a light shielding film lower layer 3A, a light shielding film intermediate layer 3B, and a light shielding film upper layer 3C.

A thickness of the above-mentioned light shielding film 3 does not need to be particularly limited, but from the viewpoint of securing a predetermined light shielding property, it is preferred that the thickness be generally in a range of 30 nm or more and 80 nm or less, for example. The light shielding film 3 is required to have an optical density (OD) of more than 2.0, preferably 2.5 or more, more preferably 2.8 or more, still more preferably 3.0 or more with respect to the exposure light in the laminate structure of the phase shift film 2.

Moreover, the above-mentioned hard mask film 4 needs to be made of a material having high etching selectivity to the light shielding film 3, which is located directly therebelow. In the still another embodiment, through selecting in particular a material containing silicon for the hard mask film 4, high etching selectivity to the light shielding film 3 made of a chromium-based material can be ensured, with the result that not only a reduction in thickness of a resist film but also a reduction in thickness of the hard mask film 4 can be achieved. Therefore, accuracy of transferring a resist pattern, which has a transfer pattern formed on the surface of the mask blank, to the hard mask film 4 is improved.

For the above-mentioned hard mask film 4, a material containing silicon (Si) may be used. An example of the material containing silicon (Si), which is suitable for the hard mask film 4 is a material containing, in addition to silicon (Si), one or more elements selected from oxygen (O), nitrogen (N), carbon (C), boron (B), and hydrogen (H). Another example of the material containing silicon (Si), which is suitable for the hard mask film 4, is a material containing, in addition to silicon (Si) and the transition metal, one or more elements selected from oxygen (O), nitrogen (N), carbon (C), boron (B), and hydrogen (H). In addition, examples of the transition metal include molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), and tin (Sn).

Specific examples of such material forming the hard mask film 4 include silicon oxide ($SiO_2$), silicon oxynitride (SiON), tantalum oxide (TaO), tantalum oxynitride (TaON), tantalum boron oxide (TaBO), and tantalum boron oxynitride (TaBON).

The hard mask film 4 formed of the material containing silicon and oxygen tends to have low adhesion with a resist film made of an organic material. Therefore, it is preferred to perform hexamethyldisilazane (HMDS) treatment on the surface of the hard mask film 4 to improve the adhesion of the surface.

The thickness of the above-mentioned hard mask film 4 does not need to be particularly limited, but the hard mask film 4 at least needs to have enough thickness not to disappear before etching of the light shielding film 3, which is located immediately therebelow, is completed. Meanwhile, when the hard mask film 4 is thick, it is difficult to reduce the thickness of a resist pattern, which is located immediately thereabove. From those viewpoints, it is preferred that the hard mask film 4 have a thickness in a range of 2 nm or more and 20 nm or less, for example.

A method of forming the above-mentioned light shielding film 3 and the above-mentioned hard mask film 4 does not need to be particularly limited, but a preferred example is, among others, a sputter deposition method. The sputter deposition method is preferred because a uniform film having a constant thickness may be formed.

Each of the mask blank 11 illustrated in FIG. 2 and the mask blank 12 illustrated in FIG. 3 may include another constituent layer, which is similar to the above-mentioned constituent layer, between the transparent substrate 1 and the phase shift film 2.

Moreover, although not shown in FIG. 1 to FIG. 3, a mask blank of a form including a resist film on a surface of the mask blank is also encompassed by the mask blank according to this invention.

Meanwhile, a modification example of the embodiment of this invention is a mask blank 10 including, on the transparent substrate 1, a phase shift film 2 having the structure in which a silicon layer 21 and a phase shift layer 22 made of a SiN-based material are laminated in the stated order. The thin film made of the SiN-based material has significantly high resistance to ArF light as compared to a thin film made of a MoSi-based material. After a transfer pattern is formed on the thin film made of the SiN-based material, and the thin film is then irradiated with the ArF excimer laser exposure light (hereinafter also referred to as "ArF exposure light") in an accumulated manner, a generated change (increase) in CD of the pattern width is significantly suppressed as compared to the case of the related-art thin film made of the MoSi-based material. However, further elongation of life of the phase shift mask is desired.

$Si_3N_4$ is a stoichiometrically stable material, and has high superiority among materials made of silicon and nitrogen in terms of the light fastness to ArF exposure light (hereinafter also referred to as "ArF light fastness"). $Si_3N_4$ has a high refractive index n with respect to a wavelength of the ArF exposure light as compared to SiNx having a small nitrogen content. Therefore, when $Si_3N_4$ is applied as the material of the phase shift film, the thickness required to impart a predetermined phase difference with respect to the ArF exposure light can be reduced. In the following, when described simply as "refractive index n", it means a refractive index n with respect to the wavelength of the ArF exposure light, and when described simply as "extinction coefficient k", it means an extinction coefficient k with respect to the wavelength of the ArF exposure light.

It is considered that the most significant factor for the change in CD of the phase shift pattern, which poses a problem for the ArF light fastness, is that, when the ArF exposure light enters inside the phase shift film, elements forming the phase shift film are photoexcited. In the case of a thin film made of the MoSi-based material, molybdenum (Mo), which is a transition metal, tends to be photoexcited. As a result, oxidation of silicon (Si) from the surface proceeds significantly to expand the volume of the pattern to a large extent. Therefore, the phase shift film made of the MoSi-based material undergoes a significant change (increase) in CD before and after the irradiation with the ArF exposure light. In the case of the phase shift film made of the SiN-based material, the transition metal is not contained, and hence the change in CD before and after the irradiation with the ArF exposure light is relatively small. However, although not to as significant level as the transition metal, silicon in the phase shift film is also photoexcited by the irradiation with the ArF exposure light.

The phase shift film of the mask blank for manufacturing the phase shift mask is formed by sputtering under film forming conditions with which an amorphous or microcrystalline structure is obtained. $Si_3N_4$ in a thin film of the amorphous or microcrystalline structure has a bonding state that is weaker than $Si_3N_4$ in a crystal film. Therefore, a $Si_3N_4$ phase shift film having the amorphous or microcrystalline structure is likely to have photoexcited silicon in the phase shift film when irradiated with the ArF exposure light. When the phase shift film is a $Si_3N_4$ crystal film, the photoexcitation of silicon in the film may be suppressed. However, when the transfer pattern is formed by dry etching in a crystal film, roughness of side walls of the pattern is poor enough to significantly exceed line edge roughness (LER) that is allowable as the transfer pattern, and hence the crystal film cannot be applied to the phase shift film.

$Si_3N_4$ is a material having a significantly small extinction coefficient k with respect to the wavelength of the ArF exposure light while having a large refractive index n. Therefore, when it is attempted to form the phase shift film of $Si_3N_4$, and to design the phase shift film so that the predetermined phase difference is a little less than 180 degrees, only a phase shift film having a high transmittance of about a little less than 20% can be manufactured. When a nitrogen content of the SiN-based material is gradually reduced, a phase shift film having a predetermined phase difference and a predetermined transmittance can be produced, but with the reduction in nitrogen content, the resistance to ArF light is also reduced as a matter of course. Therefore, when it is attempted to manufacture a phase shift film having a transmittance that is lower than that of the phase shift film made of $Si_3N_4$, the phase shift film needs to have a laminate structure of a layer made of $Si_3N_4$ and a layer for adjusting the transmittance. However, when the layer for adjusting the transmittance is simply provided, ArF light fastness of the layer is not high, and hence the phase shift mask with even longer life cannot be completed.

As a result of considering the above-mentioned facts, the inventors of this invention have reached the following conclusion: it is preferred that the mask blank 10 according to the modification example have the following configuration. That is, the mask blank 10 according to the modification example is the mask blank 10 including the phase shift film 2 on the transparent substrate 1, the phase shift film 2 having a function of transmitting ArF excimer laser exposure light with a transmittance of 2% or more, and a function of generating a phase difference of 150 degrees or more and 180 degrees or less between the ArF excimer laser exposure light that has been transmitted through the phase shift film 2 and the ArF excimer laser exposure light that has passed through air by a distance that is the same as a thickness of the phase shift film 2, the phase shift film 2 having a structure in which the silicon layer 21 and the phase shift layer 22 are laminated in the stated order from the transparent substrate 1 side, the phase shift layer 22 being formed, except for a surface layer portion thereof, of a material made of silicon and nitrogen, or a material containing, in addition to the material made of silicon and nitrogen, one or more elements selected from non-metallic elements other than oxygen, and metalloid elements, the phase shift layer 22 having a thickness that is larger than a thickness of the silicon layer 21.

In the mask blank in the modification example, the silicon layer 21 of the phase shift film 2 is arranged on the transparent substrate 1 side. With this configuration, as compared to a case in which the phase shift film 2 is formed only of the SiN-based material, a reflectance with respect to the exposure light that enters from the surface on the transparent substrate 1 side of the phase shift film 2 (hereinafter also referred to as "rear-surface reflectance") can be increased. Then, a light intensity of the ArF exposure light that enters inside the silicon layer 21 is reduced, and hence occurrence of photoexcitation of silicon inside the silicon layer 21 and the phase shift layer 22 can be reduced. With those actions, the ArF light fastness of the phase shift film 2 as a whole can be significantly increased.

As compared to the phase shift layer 22 made of the SiN-based material, the silicon layer 21 greatly attenuates the ArF exposure light that is transmitted therethrough. Therefore, even when a nitrogen content of the phase shift layer 22 is increased, it can be ensured that the phase difference of the phase shift film 2 as a whole from the exposure light falls within the above-mentioned range, and that the transmittance with respect to the exposure light is 10% or less. Other matters (such as film density) regarding the silicon layer 21 in the modification example are similar to those of the silicon layer 21 in each of the above-mentioned embodiments.

The phase shift layer 22 in the modification example has a film density of preferably more than 2.5 $g/cm^3$, more preferably 2.6 $g/cm^3$ or more. When the film density is less than 2.5 $g/cm^3$, voids in the SiN film are increased, and hence there arises a fear of receiving oxygen and other such components from the air or the like. Meanwhile, when the film density of the phase shift layer 22 exceeds 3.0 $g/cm^3$, Si—N bond in the film becomes much more solid, and there is a problem in that etching time in performing dry etching becomes much longer. The film density of the phase shift layer 22 is preferably 3.0 $g/cm^3$ or less, more preferably 2.9 $g/cm^3$ or less.

It is desired that the thickness of the silicon layer 21 in the modification example be reduced as much as possible within a range in which the above-mentioned conditions required of the phase shift film 2 are satisfied. The thickness of the silicon layer 21 is preferably less than 12 nm, more preferably 11 nm or less, still more preferably 10 nm or less. Meanwhile, in consideration of the rear-surface reflectance of the phase shift film 2 in particular, the thickness of the silicon layer 21 is preferably 3 nm or more, more preferably 4 nm or more, still more preferably 5 nm or more.

The phase shift layer 22 in the modification example is formed of a material having a relatively high ArF light fastness, and hence it is desired to increase a ratio of the thickness of the phase shift layer 22 to the thickness of the phase shift film 2 as a whole as much as possible within a range in which the above-mentioned conditions required of the phase shift film 2 are satisfied. The thickness of the phase shift layer 22 is preferably 5 times the thickness of the silicon layer 21 or more, more preferably 5.5 times the thickness or more, still more preferably 6 times the thickness or more. Moreover, it is more preferred that the thickness of the phase shift layer 22 be 10 times the thickness of the silicon layer 21 or less. The thickness of the phase shift layer 22 is preferably 80 nm or less, more preferably 70 nm or less, still more preferably 65 nm or less. Moreover, the thickness of the phase shift layer 22 is preferably 50 nm or more, more preferably 55 nm or more.

The phase shift layer 22 in the modification example is formed, except for a surface layer portion thereof, of a material made of silicon and nitrogen, or a material containing, in addition to the material made of silicon and nitrogen, one or more elements selected from non-metallic elements other than oxygen, and metalloid elements. The surface layer portion of the phase shift layer 22 refers to a surface layer portion on a side opposite to the silicon layer 21 side of the phase shift layer 22. After finishing forming the phase shift film 2 on the transparent substrate 1 by a film forming apparatus, processing of cleaning the film surface is performed. On the surface layer portion of the phase shift layer 22, which is exposed to cleaning liquid and rinsing liquid during the cleaning processing, oxidation proceeds unavoidably irrespective of the composition at the time of the film formation. Moreover, also through exposure of the phase shift film 2 to the air and performing heat treatment in the air, the oxidation of the surface layer portion of the phase shift layer 22 proceeds. As described above, it is preferred that the phase shift layer 22 be made of a material having as high refractive index n as possible. There is a tendency for the refractive index n to be reduced as an oxygen content in the material is increased, and hence except for the surface layer portion, oxygen is not positively contained in the phase shift layer 22 at the time of the film formation (the oxygen content is a detection lower limit value or less when the composition is analyzed by X-ray photoelectron spectroscopy or other such methods). As a result, the surface layer portion of the phase shift layer 22 is formed of a material obtained by adding oxygen to the material forming the phase shift layer 22 except for the surface layer portion.

The surface layer portion of the phase shift layer 22 in the modification example may be formed by various kinds of oxidation treatment. This is because the surface layer can be formed as a stable oxidation layer. Examples of the oxidation treatment include heat treatment in the air and other such gas containing oxygen, light irradiation treatment in gas containing oxygen with a flash lamp or the like, and processing of bringing ozone or oxygen plasma into contact with the surface of the phase shift layer 22. In particular, it is preferred to use heat treatment or the light irradiation treatment with the flash lamp or the like, with which the action of reducing a film stress of the phase shift film 2 is obtained at the same time. The surface layer portion of the phase shift layer 22 has a thickness of preferably 1 nm or more, more preferably 1.5 nm or more. Meanwhile, the surface layer portion of the phase shift layer 22 has a thickness of preferably 5 nm or less, more preferably 3 nm or less.

The phase shift layer 22 in the modification example does not contain the transition metal, which can be a factor that reduces the light fastness to the ArF exposure light. In addition, it is desired not to contain the metallic elements excluding the transition metal because a possibility of becoming a factor that reduces the light fastness to the ArF exposure light cannot be denied therefor. The phase shift layer 22 may contain any metalloid element in addition to silicon and nitrogen. Of those metalloid elements, it is preferred to contain one or more elements selected from boron, germanium, antimony, and tellurium because it can be expected to increase conductivity of silicon, which is used as a sputtering target.

Moreover, the phase shift layer 22 in the modification example may contain, in addition to silicon and nitrogen, a non-metallic element other than oxygen. Of those non-metallic elements, it is preferred to contain one or more elements selected from carbon, fluorine, and hydrogen. The non-metallic elements also include rare gases, such as helium (He), argon (Ar), krypton (Kr), and xenon (Xe). It is preferred that the phase shift layer 22 be made of a material having as high a refractive index n as possible, and a silicon-based material has a tendency for the refractive index n to become higher as the nitrogen content becomes larger. The nitrogen content in the material forming the phase shift layer 22 is preferably more than 50 atom %, more preferably 52 atom % or more, still more preferably 55 atom % or more.

Matters regarding the transparent substrate 1, the light shielding film 3, and the hard mask film 4 in the mask blank in the modification example are similar to the case of the mask blank 10 according to each of the above-mentioned embodiments.

This invention also provides a phase shift mask produced from the above-mentioned mask blank according to this invention, and a method of manufacturing the phase shift mask.

Figure 4A:
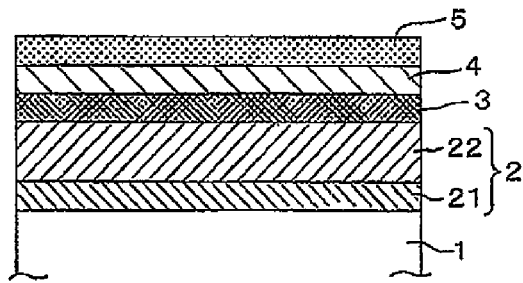
FIG. 4A is a schematic cross-sectional view for illustrating a manufacture step of a phase shift mask using the mask blank according to this invention.
Figure 4B:
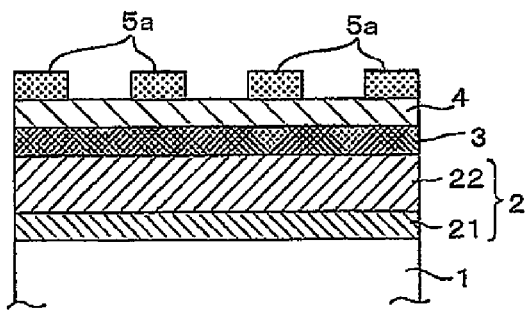
FIG. 4B is a schematic cross-sectional view for illustrating a manufacture step of the phase shift mask using the mask blank according to this invention.
Figure 4C:
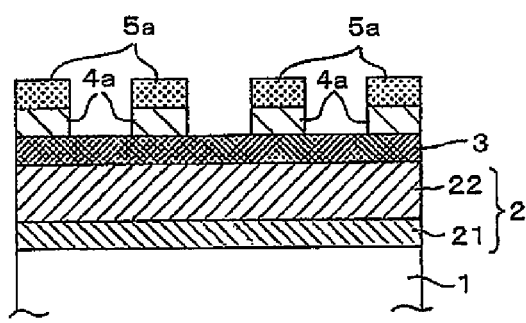
FIG. 4C is a schematic cross-sectional view for illustrating a manufacture step of the phase shift mask using the mask blank according to this invention.
Figure 4D:
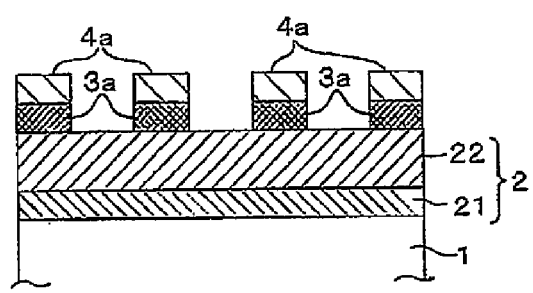
FIG. 4D is a schematic cross-sectional view for illustrating a manufacture step of the phase shift mask using the mask blank according to this invention.
Figure 4E:
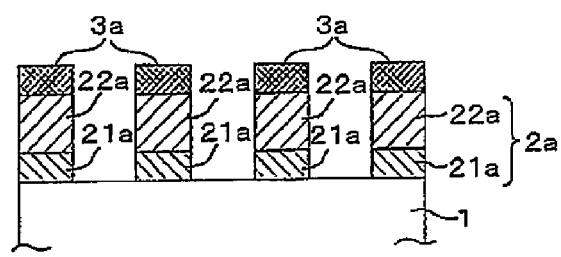
FIG. 4E is a schematic cross-sectional view for illustrating a manufacture step of the phase shift mask using the mask blank according to this invention.
Figure 5A:
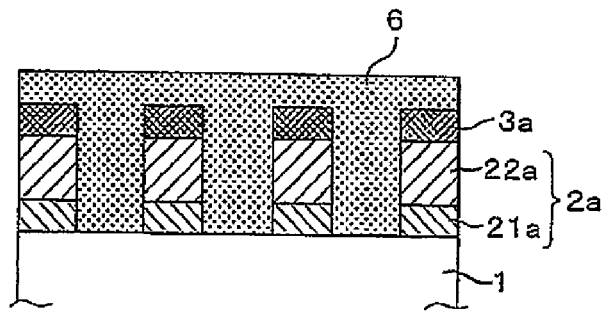
FIG. 5A is a schematic cross-sectional view for illustrating a manufacture step (following FIG. 4E) of the phase shift mask using the mask blank according to this invention.
Figure 5B:
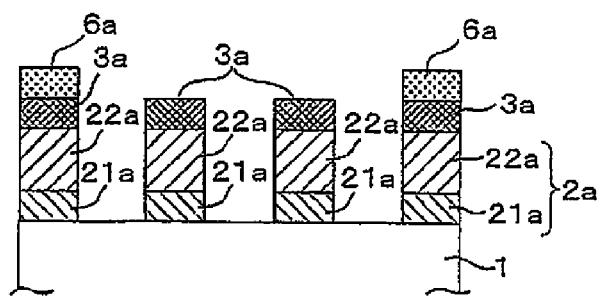
FIG. 5B is a schematic cross-sectional view for illustrating a manufacture step of the phase shift mask using the mask blank according to this invention.
Figure 5C:
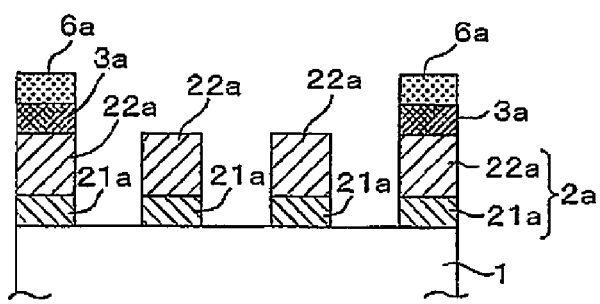
FIG. 5C is a schematic cross-sectional view for illustrating a manufacture step of the phase shift mask using the mask blank according to this invention.
Figure 5D:
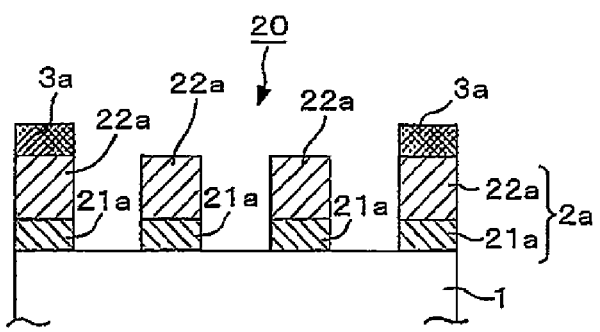
FIG. 5D is a schematic cross-sectional view for illustrating a manufacture step of the phase shift mask using the mask blank according to this invention.

FIG. 4A to FIG. 4E and FIG. 5A (following FIG. 4E) to FIG. 5D are schematic cross-sectional views of the mask blank and the like for illustrating manufacture steps of the phase shift mask using the mask blank according to this invention. Here, a description is given with the use of the mask blank 11 in the above-mentioned embodiment illustrated in FIG. 2.

First, on a surface of the mask blank 11, the resist film 5 for electron beam lithography is formed by a spin coating method (see FIG. 4A).

Next, a predetermined pattern is drawn on the resist film 5 by the electron beam lithography, and is developed after the drawing to form a predetermined resist pattern 5a (see FIG. 4B). This resist pattern 5a has a desired device pattern, which is the final transfer pattern to be formed on the phase shift film 2.

Next, a hard mask film pattern 4a, which corresponds to a pattern to be formed on the phase shift film 2, is formed on the hard mask film 4 by dry etching using the fluorine-based gas, and using as a mask the resist pattern 5a, which is formed on the hard mask film 4 of the mask blank (see FIG. 4C).

Next, after the above-mentioned resist pattern 5a is removed, a light shielding film pattern 3a, which corresponds to the pattern to be formed on the phase shift film 2, is formed on the light shielding film 3 by dry etching using the above-mentioned hard mask film pattern 4a as a mask, and using a mixture gas of a chlorine gas and an oxygen gas (see FIG. 4D).

Next, by dry etching using the above-mentioned light shielding film pattern 3a as a mask, and using a fluorine-based gas, the phase shift film 2, which is formed by laminating the silicon layer 21 and the phase shift layer 22, is successively dry-etched to form a phase shift film pattern 2a (see FIG. 4E). In this step of etching the phase shift film 2, the hard mask film pattern 4a, which is exposed on the surface, is removed.

Next, a resist film 6 similar to that described above is formed by the spin coating method on the entire surface of the substrate in the state of FIG. 4E described above (see FIG. 5A), and a predetermined device pattern (for example, pattern corresponding to a light shielding ring pattern) is drawn using an electron beam lithography apparatus, and is developed to form a predetermined resist pattern 6a (see FIG. 5B).

Subsequently, the exposed light shielding film pattern 3a is etched by dry etching using the resist pattern 6a as a mask, and using a mixture gas of a chlorine gas and an oxygen gas to remove the light shielding film pattern 3a within a transfer pattern forming region, for example, to thereby form the light shielding ring pattern in a peripheral portion of the transfer pattern forming region (see FIG. 5C).

Finally, the remaining resist pattern 6a is removed, to thereby complete a phase shift mask (for example, halftone-type phase shift mask) 20 (see FIG. 5D).

As apparent from the above description, the above-mentioned and completed phase shift mask 20 includes the phase shift film pattern 2a on the transparent substrate 1. Further, the phase shift film pattern 2a has a laminate structure of a silicon layer pattern 21a and a phase shift layer pattern 22a, and the above-mentioned silicon layer pattern 21a exists below (on the substrate side of) the above-mentioned phase shift layer pattern 22a.

When the pattern is transferred using the above-mentioned phase shift mask 20, with the existence of the silicon layer 21, the phase shift layer 22 is irradiated with the attenuated exposure light. Therefore, the transition metal contained in the phase shift layer 22 is less likely to be excited with the exposure light, and the oxidation and alteration of the phase shift layer 22 containing the transition metal silicide can be effectively suppressed. According to this invention, there can be obtained the phase shift mask having the excellent light fastness of the transition metal silicide-based phase shift film with respect to the exposure light having the wavelength of 200 nm or less, and having the excellent stability in quality.

Moreover, according to a method of manufacturing a semiconductor device, the method including the step of transferring, using the phase shift mask produced using such mask blank according to this invention, a transfer pattern of the phase shift mask onto a semiconductor substrate by a lithography method, a high-quality semiconductor device having excellent pattern accuracy can be obtained.

Meanwhile, a phase shift mask manufactured from the above-mentioned mask blank in the modification example, and a method of manufacturing the phase shift mask are similar to the above-mentioned phase shift mask according to this invention, and the method of manufacturing the phase shift mask. The light intensity of the exposure light that enters inside the silicon layer 21 is reduced, and hence occurrence of photoexcitation of silicon inside the silicon layer 21 and the phase shift layer 22 can be reduced. In addition, the phase shift layer 22 is formed of the material made of silicon and nitrogen, for example, the SiN-based material. As a result, the oxidation and alteration of the phase shift layer 22 containing the SiN-based material can be suppressed effectively. Meanwhile, a method of manufacturing a semiconductor device using the above-mentioned phase shift mask in the modification example is similar to the method of manufacturing the above-mentioned semiconductor device according to this invention.

The mask blank, the method of manufacturing the phase shift mask, the method of manufacturing the semiconductor device according to the modification example described above have the following configurations, for example.

(Structure 1A)

A mask blank, comprising a phase shift film on a transparent substrate, the phase shift film having a function of transmitting exposure light of an ArF excimer laser with a transmittance of 2% or more, and a function of generating a phase difference of 150 degrees or more and 180 degrees or less between the exposure light that has been transmitted through the phase shift film and the exposure light that has passed through air by a distance that is the same as a thickness of the phase shift film, the phase shift film having a structure in which a silicon layer and a phase shift layer are laminated in the stated order from the substrate side, the phase shift layer being formed, except for a surface layer portion thereof, of a material made of silicon and nitrogen, or a material containing, in addition to the material made of silicon and nitrogen, one or more elements selected from non-metallic elements other than oxygen, and metalloid elements, the phase shift layer having a thickness that is larger than that of the silicon layer.

(Structure 2A)

A mask blank according to Structure 1A, wherein the silicon layer has a film density of 2.1 $g/cm^3$ or more and 2.5 $g/cm^3$ or less.

(Structure 3A)

A mask blank according to Structure 1A or 2A, wherein the phase shift layer has a film density of more than 2.5 $g/cm^3$ and 3.0 $g/cm^3$ or less.

(Structure 4A)

A mask blank according to any one of Structures 1A to 3A, wherein the phase shift layer has a thickness that is 5 times the thickness of the silicon layer or more.

(Structure 5A)

A mask blank according to any one of Structures 1A to 4A, wherein the silicon layer has a thickness of 3 nm or more and less than 12 nm.

(Structure 6A)

A mask blank according to any one of Structures 1A to 5A, wherein the phase shift layer has a thickness of 80 nm or less.

(Structure 7A)

A mask blank according to any one of Structures 1A to 6A, wherein the phase shift layer has a nitrogen content of more than 50 atom %.

(Structure 8A)

A mask blank according to any one of Structures 1A to 7A, further comprising a light shielding film made of a material containing chromium on a surface of the phase shift film that is opposite to the substrate.

(Structure 9A)

A mask blank according to Structure 8A, further comprising a hard mask film made of a material containing silicon on a surface of the light shielding film that is opposite to the phase shift film.

(Structure 10A)

A method of manufacturing a phase shift mask, the method comprising a step of patterning the phase shift film of the mask blank of any one of Structures 1A to 9A.

(Structure 11A)

A phase shift mask, comprising a phase shift film pattern on a transparent substrate, the phase shift film pattern having a function of transmitting exposure light of an ArF excimer laser with a transmittance of 2% or more, and a function of generating a phase difference of 150 degrees or more and 180 degrees or less between the exposure light that has been transmitted through the phase shift film pattern and the exposure light that has passed through air by a distance that is the same as a thickness of the phase shift film, the phase shift film pattern having a structure in which a silicon layer and a phase shift layer are laminated in the stated order from the transparent substrate side, the phase shift layer being formed, except for a surface layer portion thereof, of a material made of silicon and nitrogen, or a material containing, in addition to the material made of silicon and nitrogen, one or more elements selected from non-metallic elements other than oxygen, and metalloid elements, the phase shift layer having a thickness that is larger than that of the silicon layer.

(Structure 12A)

A phase shift mask according to Structure 11A, wherein the silicon layer has a film density of 2.1 g/cm$^3$ or more and 2.5 g/cm$^3$ or less.

(Structure 13A)

A phase shift mask according to Structure 11A or 12A, wherein the phase shift layer has a film density of more than 2.5 g/cm$^3$ and 3.0 g/cm$^3$ or less.

(Structure 14A)

A phase shift mask according to any one of Structures 11A to 13A, wherein the phase shift layer has a thickness that is 5 times the thickness of the silicon layer or more.

(Structure 15A)

A phase shift mask according to any one of Structures 11A to 14A, wherein the silicon layer has a thickness of 3 nm or more and less than 12 nm.

(Structure 16A)

A phase shift mask according to any one of Structures 11A to 15A, wherein the phase shift layer has a thickness of 80 nm or less.

(Structure 17A)

A phase shift mask according to any one of Structures 11A to 16A, wherein the phase shift layer has a nitrogen content of more than 50 atom %.

(Structure 18A)

A phase shift mask according to any one of Structures 11A to 17A, further comprising a light shielding film pattern made of a material containing chromium on a surface of the phase shift film pattern that is opposite to the substrate.

(Structure 19A)

A method of manufacturing a semiconductor device, the method comprising a step of transferring, using the phase shift mask manufactured by the method of manufacturing a phase shift mask of Structure 10A, a transfer pattern of the phase shift mask onto a semiconductor substrate by a lithography method.

(Structure 20A)

A method of manufacturing a semiconductor device, the method comprising a step of transferring, using the phase shift mask of any one of Structures 11A to 18A, a transfer pattern of the phase shift mask onto a semiconductor substrate by a lithography method.

EXAMPLE

Now, this invention will be described in more detail by way of Examples.

Example 1

Example 1 according to this invention relates to a mask blank and manufacture of a phase shift mask for use in manufacture of a halftone-type phase shift mask using ArF excimer laser having a wavelength of 193 nm as the exposure light.

The mask blank 12 used in Example 1 has the structure in which, as illustrated in FIG. 3, on the transparent substrate (glass substrate) 1, the phase shift film 2, which is formed by laminating the silicon layer 21 and the phase shift layer 22, the light shielding film 3 having the three-layer laminate structure, and the hard mask film 4 are laminated in the stated order. This mask blank 12 was manufactured as follows.

As the glass substrate 1, a synthetic quartz substrate (having a size of about 152 mm by about 152 mm and a thickness of 6.35 mm) was prepared.

Next, the phase shift film 2, which is formed by laminating the silicon layer 21 and the phase shift layer 22, is formed.

First, the above-mentioned synthetic quartz substrate 1 was placed in a sheet-type RF sputtering apparatus, and the silicon (Si) layer 21 was formed to have a thickness of 8 nm on the synthetic quartz substrate by RF sputtering using a silicon (Si) target, and using argon (Ar) gas (pressure=5× 10$^{-2}$ Pa) as a sputtering gas. The formed Si layer 21 had a refractive index of 0.95, and an extinction coefficient of 2.70 with respect to exposure light having the wavelength of 193 nm.

Next, the synthetic quartz substrate 1 having the silicon layer 21 formed thereon was placed in a sheet-type DC sputtering apparatus, and a MoSiON phase shift layer 22 made of molybdenum, silicon, oxygen, and nitrogen was formed to have a thickness of 75 nm on the silicon layer 21 by reactive sputtering (DC sputtering) using a mixed sintered target of molybdenum (Mo) and silicon (Si) (Mo:Si=4 atom %:96 atom %), and using as a sputtering gas a mixture gas of argon (Ar), nitrogen (N$_2$), oxygen (O$_2$), and helium (He) (at a ratio of flow rates of ArN$_2$:O$_2$:He=13:50:6:100 and a pressure of 0.2 Pa). A composition of the formed MoSiON phase shift layer was Mo:Si:O:N=5:30:39:26 (atom % ratio). The composition was measured by XPS. The formed MoSiON layer 22 had the refractive index of 2.38, and the extinction coefficient of 0.32 with respect to the exposure light having the wavelength of 193 nm.

The phase shift film 2 having the two-layer structure, which was formed as described above, had a total thickness of 83 nm, the phase difference of 176.3 degrees with respect to the exposure light having the wavelength of 193 nm, and the transmittance of 6.08%.

Next, a light shielding film 3 having a laminate structure of a lower layer 3A made of a CrOCN film, an intermediate layer 3B made of a CrN film, and an upper layer 3C made of a CrOCN film was formed on the above-mentioned phase shift film 2. Specifically, reactive sputtering was performed in a mixture gas atmosphere of argon (Ar), carbon dioxide (CO$_2$), nitrogen (N$_2$), and helium (He) (at a ratio of flow rates of Ar:CO$_2$:N$_2$:He=20:25:13:30 and a pressure of 0.3 Pa) using a target made of chromium so that the lower layer 3A of the light shielding film made of the CrOCN film was formed to have a thickness of 30 nm on the above-mentioned phase shift film 2. Subsequently, reactive sputtering was performed in a mixture gas atmosphere of argon (Ar) and nitrogen (N$_2$) (at a ratio of flow rates of Ar:N$_2$=25:5 and a pressure of 0.3 Pa) similarly using the target made of chromium so that the intermediate layer 3B of the light shielding film made of the CrN film was formed to have a thickness of 4 nm on the above-mentioned lower layer 3A. Then, reactive sputtering was performed in a mixture gas atmosphere of argon (Ar), carbon dioxide (CO$_2$), nitrogen (N$_2$), and helium (He) (at a ratio of flow rates of Ar:CO$_2$: N$_2$:He=20:24:22:30 and a pressure of 0.3 Pa) similarly using the target made of chromium so that the upper layer 3C of the light shielding film made of the CrOCN film was formed to have a thickness of 14 nm on the above-mentioned intermediate layer 3B.

A composition of the formed CrOCN film as the lower layer 3A of the light shielding film was Cr:O:C:N=55.2: 22.1:11.6:11.1 (atom % ratio). Moreover, a composition of the CrN film as the intermediate layer 3B of the light shielding film was Cr:N=76.2:23.8 (atom % ratio), and a composition of the CrOCN film as the upper layer 3C of the light shielding film was Cr:O:C:N=49.2:23.8:13.0:14.0 (atom % ratio). Those compositions were measured by XPS.

Next, the hard mask film 4 made of a $SiO_2$ film was formed on the above-mentioned light shielding film 3. Specifically, reactive sputtering was performed in a gas atmosphere of argon (Ar) (at a pressure of 0.3 Pa) using a target of silicon dioxide ($SiO_2$) so that the hard mask film 4 made of the $SiO_2$ film was formed to have a thickness of 5 nm on the above-mentioned light shielding film 3.

An optical density of the above-mentioned laminate film of the phase shift film 2 and the light shielding film 3 was 3.0 or more (transmittance of 0.1% or less) at the wavelength (193 nm) of the ArF excimer laser.

The mask blank 12 according to Example 1 was manufactured as described above.

Next, a halftone-type phase shift mask was manufactured using the mask blank 12 and following the above-mentioned manufacture steps illustrated in FIG. 4A to FIG. 4E and FIG. 5A to FIG. 5D. Reference numerals in the following description correspond to the reference numerals in FIG. 4A to FIG. 4E and FIG. 5A to FIG. 5D.

First, HMDS processing was performed on an upper surface of the above-mentioned mask blank 12. A chemical amplification resist for electron beam lithography (PRL 009 manufactured by FUJIFILM Electronic Materials Co., Ltd.) was applied by spin coating, and predetermined baking processing was performed so that the resist film 5 was formed to have a thickness of 80 nm (see FIG. 4A).

Next, a predetermined device pattern (pattern corresponding to a phase shift pattern to be formed on the phase shift film 2) was drawn on the above-mentioned resist film 5 using an electron beam lithography apparatus. Then, the resist film was developed to form the resist pattern 5a (see FIG. 4B).

Next, the hard mask film 4 was dry-etched using the above-mentioned resist pattern 5a as a mask to form the hard mask film pattern 4a (see FIG. 4C). A fluorine-based gas ($CF_4$) was used as a dry etching gas.

After removing the above-mentioned resist pattern 5a, the light shielding film 3 formed of the laminate film of the upper layer 3C, the intermediate layer 3B, and the lower layer 3A was dry-etched successively using the above-mentioned hard mask film pattern 4a as a mask to form the light shielding film pattern 3a (see FIG. 4D). A mixture gas of $Cl_2$ and $O_2$ ($Cl_2:O_2=4:1$ (ratio of flow rates)) was used as a dry etching gas.

Subsequently, using the above-mentioned light shielding film pattern 3a as a mask, dry etching was sequentially performed on the phase shift film 2, which was formed by laminating the silicon layer 21 and the phase shift layer 22, to form the phase shift film pattern 2a (see FIG. 4E). A fluorine-based gas ($SF_6$) was used as a dry etching gas. In the etching step of the phase shift film 2, the hard mask film pattern 4a that is exposed on the front surface was removed.

Next, the resist film 6 similar to the above-mentioned resist film was formed on the entire surface of the substrate in the above-mentioned state of FIG. 4E by spin coating (see FIG. 5A). A predetermined device pattern (for example, pattern corresponding to light shielding ring pattern) was drawn using an electron beam lithography apparatus, and was then developed to form the predetermined resist pattern 6a (see FIG. 5B). Subsequently, the exposed light shielding film pattern 3a was etched using the resist pattern 6a as a mask to remove the light shielding film pattern 3a in a transfer pattern forming region, for example, and a light shielding ring pattern was formed in a peripheral portion of the transfer pattern forming region (see FIG. 5C). A mixture gas of $Cl_2$ and $O_2$ ($Cl_2:O_2=8:1$ (ratio of flow rates)) was used as a dry etching gas in this case.

Finally, the remaining resist pattern 6a was removed to manufacture the halftone-type phase shift mask 20 (see FIG. 5D).

A transmittance and a phase difference of the above-mentioned phase shift film pattern 2a were hardly changed from those at the time when the mask blank was manufactured.

[Evaluation]

As a result of performing an inspection of a mask pattern on the obtained phase shift mask 20 by a mask inspection apparatus, it was confirmed that a fine pattern was formed within an allowable range from a design value. Moreover, the obtained phase shift mask 20 was irradiated consecutively with ArF excimer laser to a total amount of irradiation of 30 $kJ/cm^2$. As described above, an amount of irradiation of 30 $kJ/cm^2$ (energy density: about 25 $mJ/cm^2$) corresponds to using the phase shift mask 20 approximately 100,000 times, and corresponds to using for about 3 months at a normal usage frequency of the phase shift mask 20.

When the transmittance and the phase difference of the phase shift film 2 (Si layer+MoSiON layer) after the above-mentioned irradiation were measured, the transmittance was 6.12%, and the phase difference was 176.1 degrees for ArF excimer laser (wavelength: 193 nm). Therefore, the amounts of change before and after the irradiation are suppressed to be small at the transmittance of +0.04% and the phase difference of −0.2 degrees, and the amounts of change at this level does not affect the performance of the phase shift mask 20. Moreover, when a cross section of the phase shift film pattern 2a was observed in detail using a transmission electron microscope (TEM), a thick altered layer, which had been generated in the related art, was not found, and the increase in line width (amount of change in CD) was also suppressed to 2 nm or less. Therefore, it is understood that the mask blank according to Example 1 and the phase shift mask manufactured using the mask blank have extremely high light fastness for the accumulated irradiation by an exposure light source having a short wavelength of 200 nm or less.

Example 2

A mask blank in Example 2 of this invention was manufactured in a procedure that is similar to that for the mask blank in Example 1 except that a SiN film was applied as a material for forming the phase shift layer 22 of the phase shift film 2. Specifically, the transparent substrate 1 was placed in a sheet-type RF sputtering apparatus, and the silicon layer 21 was formed to be in contact with the surface of the transparent substrate 1 and to have a thickness of 8 nm by RF sputtering using a silicon (Si) target, and using the argon (Ar) gas as a sputtering gas. Subsequently, the phase shift layer 22 made of silicon and nitrogen (SiN film of Si:N=43 atom %:57 atom %) was formed on the silicon layer 21 to have a thickness of 63 nm by reactive sputtering (RF sputtering) using a silicon (Si) target, and using as a sputtering gas a mixture gas of argon (Ar) and nitrogen ($N_2$). Through the above-mentioned procedure, the phase shift film 2, which was formed by laminating the silicon layer 21 and the phase shift layer 22, to be in contact with the surface of the transparent substrate 1 and have a thickness of 71 nm. In this phase shift film 2, a thickness of the phase shift layer 22 is 7.9 times a thickness of the silicon layer 21. A composition of the phase shift layer 22 was a result obtained through measurement by X-ray photoelectron spectroscopy (XPS).

On the transparent substrate 1 having the phase shift film 2 formed thereon, heat treatment for reducing the film stress of the phase shift film 2 and for forming the oxidation layer in a surface layer portion was performed. When the transmittance and the phase difference of the phase shift film 2 with respect to light having the wavelength of 193 nm were measured using a phase shift amount measurement apparatus (MPM193 manufactured by Lasertec Corporation), the transmittance was 6.1%, and the phase difference was 177.0 degrees (deg). Moreover, when the phase shift film 2 was analyzed with a scanning electron microscope (STEM) and energy dispersive X-ray spectroscopy (EDX), it was confirmed that the oxidation layer was formed in the surface layer portion having a thickness of about 2 nm from the surface of the phase shift layer 22. Further, when respective optical characteristics of the silicon layer 21 and the phase shift layer 22 of the phase shift film 2 were measured, the silicon layer 21 had the refractive index n of 1.06 and the extinction coefficient k of 2.72, and the phase shift layer 22 had the refractive index n of 2.63 and the extinction coefficient k of 0.37. The rear-surface reflectance (reflectance on the transparent substrate 1 side) of the phase shift film 2 with respect to light having the wavelength of 193 nm was 44.1%.

Next, on the phase shift film 2, the light shielding film 3 and the hard mask film 4 were formed in a procedure that is similar to that for the mask blank in Example 1. Through the above-mentioned procedure, there was manufactured the mask blank 12 in Example 2 having the structure in which, on the transparent substrate 1, the phase shift film 2, which is formed of the silicon layer 21 and the phase shift layer 22 made of SiN, the light shielding film 3, and the hard mask film 4 are laminated.

Next, the phase shift mask 20 in Example 2 was manufactured using the mask blank 12 in Example 2 in a procedure that is similar to that in Example 1. Dry etching using $SF_6$+He was performed on the phase shift film 2, and a ratio of the etching rate of the silicon layer 21 to the etching rate of the phase shift layer 22 at the time was 2.06.

[Evaluation]

As a result of performing an inspection of a mask pattern on the obtained phase shift mask 20 in Example 2 by a mask inspection apparatus, it was confirmed that a fine pattern was formed within an allowable range from a design value. Moreover, irradiation treatment of intermittently irradiating the obtained phase shift mask with ArF excimer laser was performed to obtain a total amount of irradiation of 40 $kJ/cm^2$. The amount of change in CD of the phase shift film pattern 2a before and after the irradiation treatment was 1.5 nm.

Further, on the phase shift mask 20 after the irradiation treatment with ArF excimer laser light had been performed thereon, simulation was performed of an exposure transfer image obtained when exposure transfer had been performed on the resist film on the semiconductor device with the exposure light having the wavelength of 193 nm using AIMS 193 (manufactured by Carl Zeiss AG). When the exposure transfer image obtained in the simulation was checked, a design specification was sufficiently satisfied. Based on the result, it can be said that even when the phase shift mask 20 produced from the mask blank in Example 2 is set in the exposure apparatus, and exposure transfer with ArF excimer laser exposure light is performed to a cumulative amount of irradiation of 40 $kJ/cm^2$, the exposure transfer can be performed with high accuracy on the resist film on the semiconductor device.

Comparative Example

In the mask blank used in Example 1 described above, the light shielding film and the hard mask film were formed as in Example 1 except that the formation of the silicon layer was omitted, and that a MoSiON layer was formed as the phase shift film on the surface of the substrate 1, to thereby manufacture a mask blank in Comparative Example.

Heat treatment was performed on the transparent substrate having the above-mentioned MoSiON film formed thereon. Specifically, heat treatment was performed in the air at a heating temperature of 400° C. for heating time of 2 hours. The MoSiON film had the transmittance of 6.11% and the phase difference of 175.6 degrees for ArF excimer laser. Moreover, when a cross section of the MoSiON film after the heat treatment was observed in detail using the transmission electron microscope (TEM), a surface layer portion of the MoSiON film had not changed in particular, and no such thing as coating was formed.

Next, as in Example 1, a phase shift mask was produced using the mask blank in Comparative Example described above. A transmittance and a phase difference of the phase shift film of the produced phase shift mask were hardly changed from those at the time when the mask blank was produced.

The obtained phase shift mask in Comparative Example was irradiated consecutively with ArF excimer laser to a total amount of irradiation of 30 $kJ/cm^2$. When a transmittance and a phase difference of the phase shift film (MoSiON film) after the irradiation were measured, the transmittance was 7.69%, and the phase difference was 170.8 degrees for ArF excimer laser. Therefore, amounts of change before and after the irradiation were very large at +1.58% for the transmittance and −4.8 degrees for the phase difference. When the amounts of change at those levels occur, the phase shift mask cannot be used as a photomask any more. Moreover, when a cross section of the phase shift film pattern was observed in detail using the transmission electron microscope (TEM), the altered layer that had been generated in the related art was recognized, and an increase in line width thereby (amount of change in CD) was found to be 10 nm.

The embodiments and Examples of this invention have been described above. However, those embodiments and Examples are merely exemplary, and do not limit the scope of claims. The technology described in the scope of claims encompasses various alterations and modifications to the specific examples exemplified above.

This application is based upon and claims the benefit of priority from Japanese Patent Application No. 2015-067259, filed on Mar. 27, 2015, the disclosure of which is incorporated herein its entirety by reference.

REFERENCE SIGNS LIST 1 transparent substrate
2 phase shift film
21 silicon layer
22 phase shift layer
3 light shielding film
4 hard mask film
5, 6 resist film
10, 11, 12 mask blank
20 phase shift mask

The invention claimed is:

1. A mask blank, comprising a phase shift film on a transparent substrate,
the phase shift film having a function of transmitting exposure light of an ArF excimer laser with a transmittance of 2% or more, and a function of generating a phase difference of 150 degrees or more between the exposure light that has been transmitted through the phase shift film and the exposure light that has passed through air by a distance that is the same as a thickness of the phase shift film, the phase shift film having a structure in which a silicon layer and a phase shift layer are laminated in the stated order from the substrate side, the phase shift layer being formed, except for a surface layer portion thereof, of a material made of silicon and nitrogen, or a material containing, in addition to the material made of silicon and nitrogen, one or more elements selected from non-metallic elements other than oxygen, and metalloid elements, the phase shift layer having a thickness that is larger than that of the silicon layer, wherein the silicon layer has a thickness of 3 nm or more and less than 12 nm.

2. A mask blank according to claim 1, wherein the silicon layer has a film density of 2.1 g/cm$^3$ or more and 2.5 g/cm$^3$ or less.

3. A mask blank according to claim 1, wherein the phase shift layer has a film density of more than 2.5 g/cm$^3$ and 3.0 g/cm$^3$ or less.

4. A mask blank according to claim 1, wherein the phase shift layer has a thickness that is 5 times the thickness of the silicon layer or more.

5. A mask blank according to claim 1, wherein the phase shift layer has a thickness of 80 nm or less.

6. A mask blank according to claim 1, wherein the phase shift layer has a nitrogen content of more than 50 atom %.

7. A mask blank according to claim 1, further comprising a light shielding film made of a material containing chromium on a surface of the phase shift film that is opposite to the substrate.

8. A mask blank according to claim 7, further comprising a hard mask film made of a material containing silicon on a surface of the light shielding film that is opposite to the phase shift film.

9. A method of manufacturing a phase shift mask, the method comprising a step of patterning the phase shift film of the mask blank of claim 1.

10. A phase shift mask, comprising a phase shift film pattern on a transparent substrate, the phase shift film pattern having a function of transmitting exposure light of an ArF excimer laser with a transmittance of 2% or more, and a function of generating a phase difference of 150 degrees or more between the exposure light that has been transmitted through the phase shift film pattern and the exposure light that has passed through air by a distance that is the same as a thickness of the phase shift film pattern, the phase shift film pattern having a structure in which a silicon layer and a phase shift layer are laminated in the stated order from the transparent substrate side, the phase shift layer being formed, except for a surface layer portion thereof, of a material made of silicon and nitrogen, or a material containing, in addition to the material made of silicon and nitrogen, one or more elements selected from non-metallic elements other than oxygen, and metalloid elements, the phase shift layer having a thickness that is larger than that of the silicon layer, wherein the silicon layer has a thickness of 3 nm or more and less than 12 nm.

11. A phase shift mask according to claim 10, wherein the silicon layer has a film density of 2.1 g/cm$^3$ or more and 2.5 g/cm$^3$ or less.

12. A phase shift mask according to claim 10, wherein the phase shift layer has a film density of more than 2.5 g/cm$^3$ and 3.0 g/cm$^3$ or less.

13. A phase shift mask according to claim 10, wherein the phase shift layer has a thickness that is 5 times the thickness of the silicon layer or more.

14. A method of manufacturing a semiconductor device, the method comprising a step of transferring, using the phase shift mask manufactured by the method of manufacturing a phase shift mask of claim 9, a transfer pattern of the phase shift mask onto a semiconductor substrate by a lithography method.

15. A phase shift mask according to claim 10, wherein the phase shift layer has a thickness of 80 nm or less.

16. A phase shift mask according to claim 10, wherein the phase shift layer has a nitrogen content of more than 50 atom %.

17. A phase shift mask according to claim 10, further comprising a light shielding film pattern made of a material containing chromium on a surface of the phase shift film pattern that is opposite to the substrate.

18. A method of manufacturing a semiconductor device, the method comprising a step of transferring, using the phase shift mask of claim 10, a transfer pattern of the phase shift mask onto a semiconductor substrate by a lithography method.

* * * * *